United States Patent
Wong et al.

(10) Patent No.: US 7,355,462 B1
(45) Date of Patent: Apr. 8, 2008

(54) PHASE LOCK LOOP AND METHOD FOR OPERATING THE SAME

(75) Inventors: Wilson Wong, San Francisco, CA (US);
Rakesh H. Patel, Cupertino, CA (US);
Sergey Shumarayev, San Leandro, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/456,484

(22) Filed: Jul. 10, 2006

(51) Int. Cl.
*H03L 7/06* (2006.01)

(52) U.S. Cl. .......................................... 327/156; 331/34
(58) Field of Classification Search ............... None
See application file for complete search history.

(56) References Cited

U.S. PATENT DOCUMENTS

| | | | | |
|---|---|---|---|---|
| 4,048,581 A * | 9/1977 | Lyberg | .......................... | 331/1 A |
| 4,646,031 A * | 2/1987 | Fast et al. | ....................... | 331/25 |
| 5,525,935 A * | 6/1996 | Joo et al. | ........................ | 331/11 |
| 5,757,238 A * | 5/1998 | Ferraiolo et al. | .............. | 331/16 |
| 5,982,208 A * | 11/1999 | Kokubo et al. | .............. | 327/119 |
| 6,653,874 B2 * | 11/2003 | Ishikawa | ....................... | 327/144 |
| 6,674,332 B1 * | 1/2004 | Wunner et al. | ................ | 331/18 |
| 6,686,784 B2 * | 2/2004 | Chang | .......................... | 327/157 |
| 6,912,260 B2 * | 6/2005 | Young et al. | ................. | 375/362 |
| 6,970,046 B2 * | 11/2005 | Da Dalt et al. | ................ | 331/16 |
| 7,003,023 B2 * | 2/2006 | Krone et al. | .................. | 375/219 |
| 7,180,377 B1 * | 2/2007 | Leong et al. | .................. | 331/17 |
| 2005/0129134 A1 * | 6/2005 | Itri | ............................... | 375/259 |

\* cited by examiner

*Primary Examiner*—Cassandra Cox
(74) *Attorney, Agent, or Firm*—Martine Penilla & Gencarella, LLP

(57) ABSTRACT

A digital controller for a voltage controlled oscillator (VCO) is provided within a phase lock loop (PLL). The digital controller includes a digital filter having first and second inputs for receiving upward and downward adjustment signals, respectively. The digital filter generates an increment signal and a decrement signal in response to the upward and downward adjustment signals, respectively. The digital controller includes a digital counter having first and second inputs for receiving the increment and decrement signals, respectively. The digital counter generates a multi-bit output signal that represents a running sum of the increment and decrement signals. The digital controller further includes a digital-to-analog converter (DAC) having an input for receiving the running sum output signal generated by the digital counter. The DAC is defined to generate a control voltage for the VCO in response to receipt of the running sum output signal from the digital counter.

25 Claims, 11 Drawing Sheets

| Divisor Setting | div[0] | div[1] | div[2] |
|---|---|---|---|
| 1 | 0 | 0 | 0 |
| 2 | 0 | 0 | 1 |
| 3 | 0 | 1 | 0 |
| 4 | 0 | 1 | 1 |
| 5 | 1 | 0 | 0 |
| 6 | 1 | 0 | 1 |
| 7 | 1 | 1 | 0 |
| 8 | 1 | 1 | 1 |

Digital Counter to DAC (M=4)

| bit 3 | bit 2 | bit 1 | bit 0 | Decimal Value | DAC Output V |
|---|---|---|---|---|---|
| 0 | 0 | 0 | 0 | 0 | 0.00 |
| 0 | 0 | 0 | 1 | 1 | 0.08 |
| 0 | 0 | 1 | 0 | 2 | 0.16 |
| 0 | 0 | 1 | 1 | 3 | 0.24 |
| 0 | 1 | 0 | 0 | 4 | 0.32 |
| 0 | 1 | 0 | 1 | 5 | 0.40 |
| 0 | 1 | 1 | 0 | 6 | 0.48 |
| 0 | 1 | 1 | 1 | 7 | 0.56 |
| 1 | 0 | 0 | 0 | 8 | 0.64 |
| 1 | 0 | 0 | 1 | 9 | 0.72 |
| 1 | 0 | 1 | 0 | 10 | 0.80 |
| 1 | 0 | 1 | 1 | 11 | 0.88 |
| 1 | 1 | 0 | 0 | 12 | 0.96 |
| 1 | 1 | 0 | 1 | 13 | 1.04 |
| 1 | 1 | 1 | 0 | 14 | 1.12 |
| 1 | 1 | 1 | 1 | 15 | 1.20 |

Fig. 5A

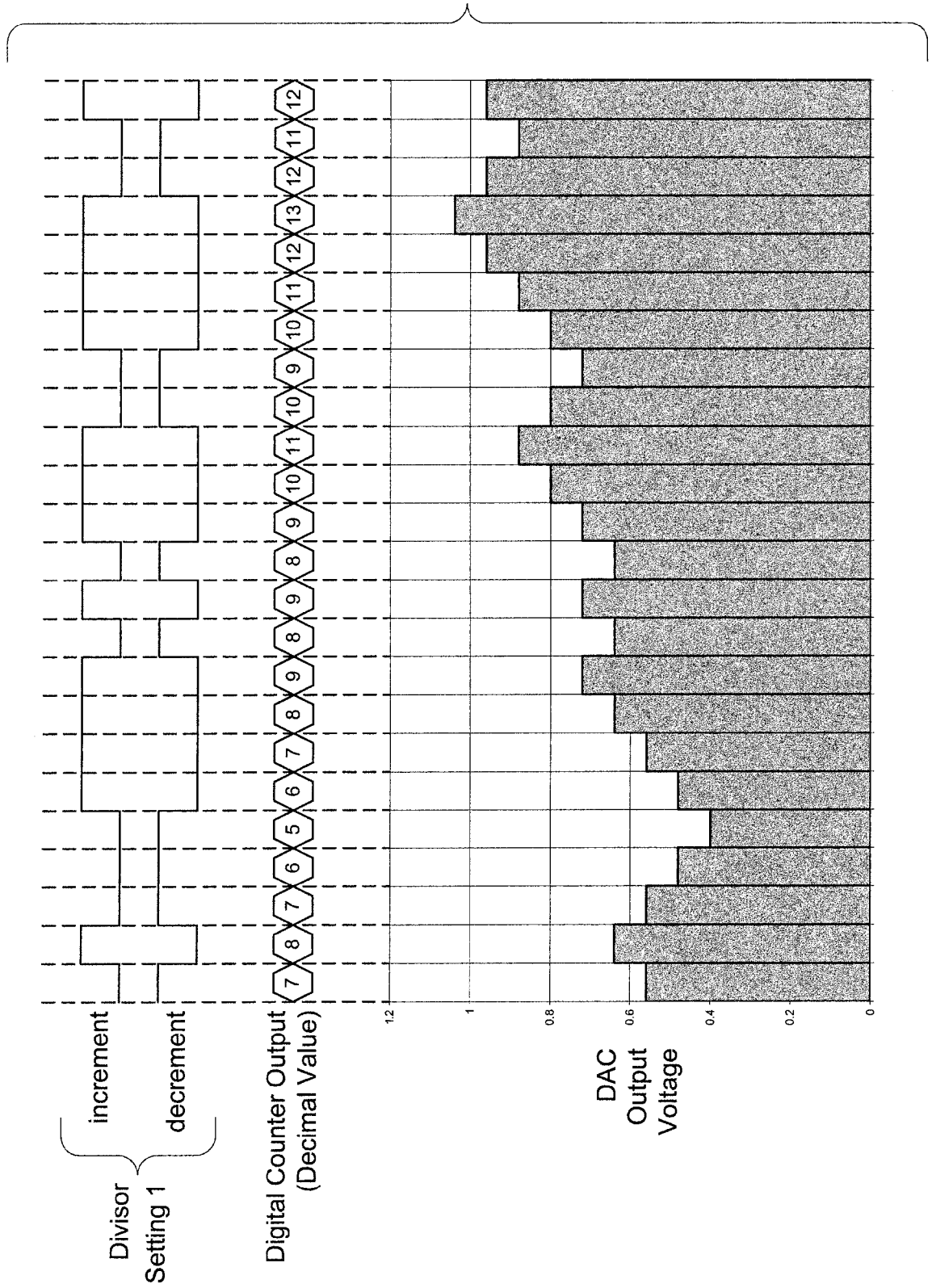

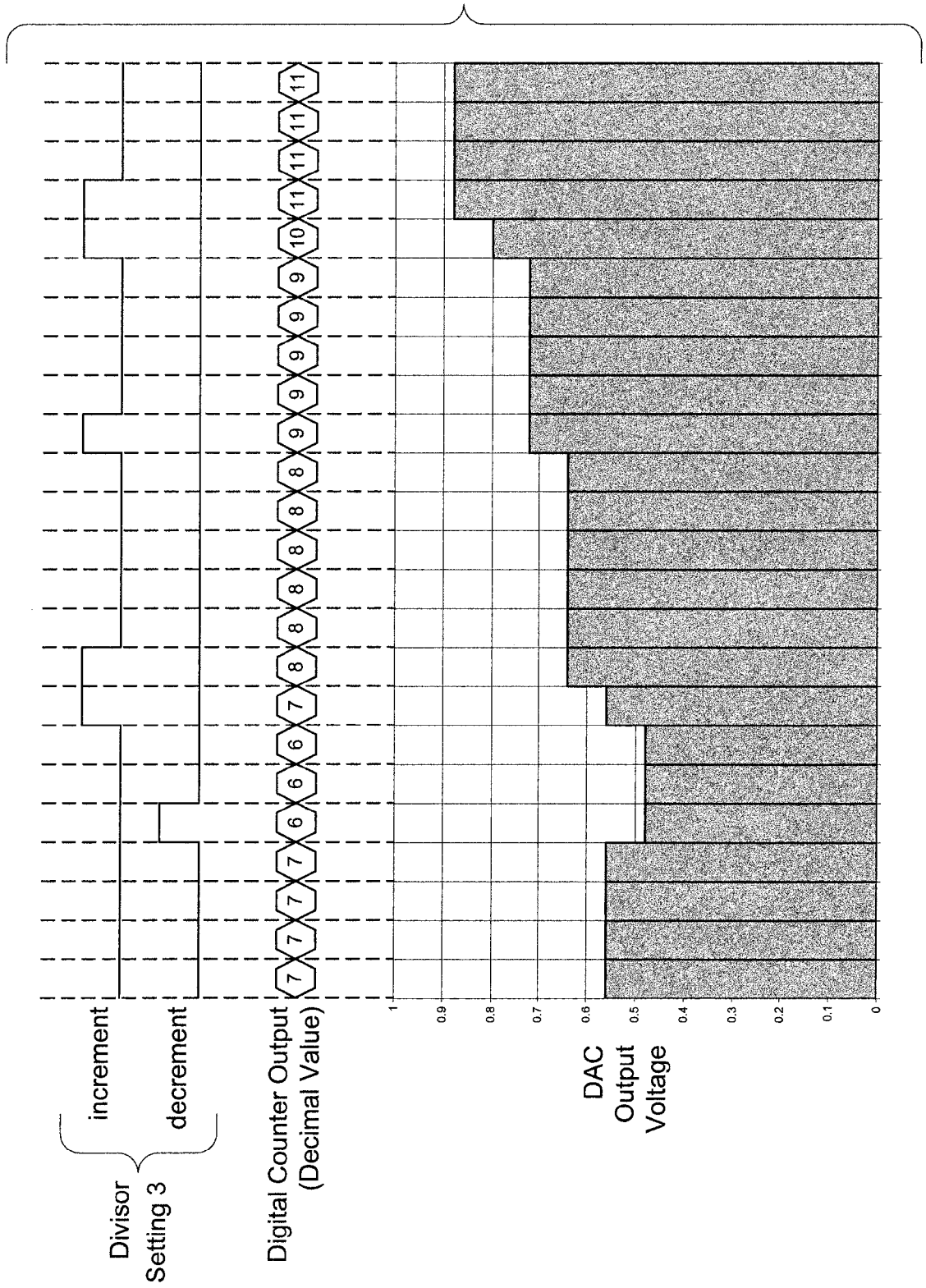

PHASE LOCK LOOP AND METHOD FOR OPERATING THE SAME

BACKGROUND

Migration of circuit design to sub-micron CMOS poses many challenges. For example, traditional analog circuits are not scalable to sub-micron technology. Many analog parameters degrade when shrunk to sub-micron levels. These analog parameters can include output resistance, leakage, headroom, and matching. Due to the foregoing, analog circuits are difficult to migrate from one technology to another. In contrast, digital logic circuitry can be migrated to sub-micron technology without much difficulty, and may actually realize benefits from such migration.

Thus, conversion of analog circuitry to equivalent digital logic circuitry can be advantageous for facilitating circuit migration to sub-micron technology. More specifically, once an analog circuit block is converted to an equivalent digital circuit block, the equivalent digital circuit block can be more easily migrated to sub-micron technology. Conversion of analog circuitry to digital circuitry and subsequent migration of the digital circuitry to sub-micron nodes can provide savings in engineering design time as compared with attempts to directly migrate the analog circuitry to a sub-micron version thereof.

SUMMARY

In one embodiment, a digital controller for a voltage controlled oscillator (VCO) is disclosed. The digital controller includes a digital filter, a digital counter, and a digital-to-analog converter (DAC). The digital filter has a first input for receiving an upward adjustment signal and a second input for receiving a downward adjustment signal. The digital filter is defined to generate an increment signal and a decrement signal in response to the upward and downward adjustment signals, respectively. The digital counter has a first input for receiving the increment signal from the digital filter and a second input for receiving the decrement signal from the digital filter. The digital counter is defined to generate a multi-bit output signal that represents a running sum of the increment and decrement signals. The DAC has a multi-bit input for receiving the multi-bit output signal to be generated by the digital counter. The DAC is defined to generate a control voltage for the VCO in response to receipt of the multi-bit output signal from the digital counter.

In another embodiment, a phase lock loop (PLL) circuit is disclosed. The PLL includes a phase detector defined to generate an upward adjustment signal when a phase of a feedback signal lags a phase of a reference clock signal. The phase detector is further defined to generate a downward adjustment signal when the phase of the feedback signal leads the phase of the reference clock signal. The PLL also includes a digital controller defined to receive and process the upward and downward adjustment signals in a digital manner to generate a control voltage in response to the upward and downward adjustment signals. A VCO is defined to receive the control voltage from the digital controller and generate a PLL output signal having a frequency that is a function of the received control voltage. The PLL further includes a frequency divider defined to receive the PLL output signal and divide the frequency of the PLL output signal by an integer value to generate the feedback signal to be processed by the phase detector.

In another embodiment, a method is disclosed for operating a PLL. The method includes an operation for generating an upward adjustment signal when a phase of a feedback signal lags a phase of a reference clock signal. An operation is also provided for generating a downward adjustment signal when the phase of the feedback signal leads the phase of the reference clock signal. The feedback signal represents a frequency divided version of an output signal of the PLL. The method also includes an operation for processing the upward and downward adjustment signals in a digital manner to generate a control voltage in response to the upward and downward adjustment signals. The method further includes an operation for operating a VCO to generate the output signal of the PLL in response to the control voltage.

Other aspects and advantages of the invention will become more apparent from the following detailed description, taken in conjunction with the accompanying drawings, illustrating by way of example the present invention.

BRIEF DESCRIPTION OF THE DRAWINGS

FIGS. 4A-4B are illustrations showing an example of the functionality provided by the digital filter of the digital VCO controller, in accordance with one embodiment of the present invention;

FIG. 5A is an illustration showing an example of the functionality provided by the digital counter and DAC of the digital VCO controller, in accordance with one embodiment of the present invention;

FIGS. 5B-5D are illustrations showing an example of the functional interaction between the digital filter, the digital counter, and the DAC, in accordance with one embodiment of the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
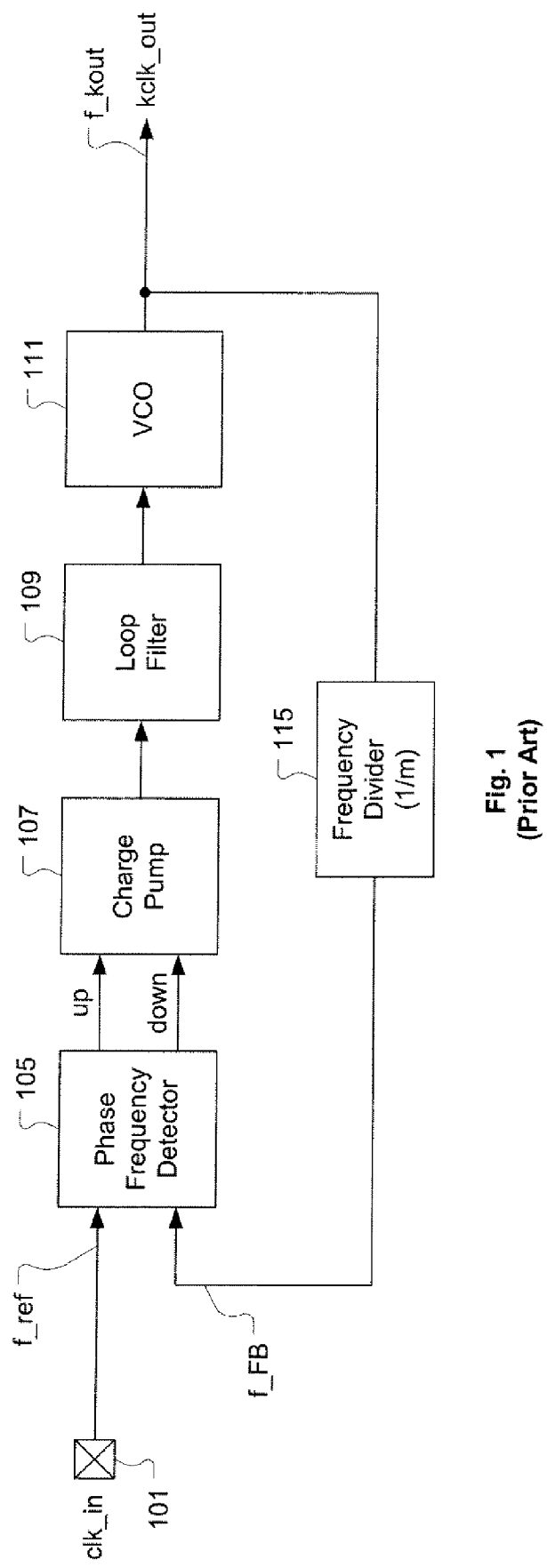
FIG. 1 is an illustration showing an analog phase lock loop (PLL)

FIG. 1 is an illustration showing an analog phase lock loop (PLL). The PLL is a linear system capable of synthesizing a clock frequency from a reference clock signal (clk_in) having a reference clock frequency (f_ref). The reference clock signal (clk_in) is provided to a PLL input 101. From the PLL input 101, the reference clock signal (clk_in) having the reference clock frequency (f_ref) is provided as a first input to a phase frequency detector 105. The phase frequency detector 105 is also defined to receive a feedback signal having a frequency (f_FB) at a second input. The feedback signal represents a frequency divided version of the PLL output signal.

The phase frequency detector 105 is defined to analyze the phase difference between the signals received at its inputs, i.e., the reference clock signal and the feedback signal. Based on the analyzed phase difference, the phase frequency detector 105 generates either an up pulse or a down pulse. The up pulse is generated when the phase of the reference clock signal leads the phase of the feedback clock signal. Conversely, the down pulse is generated when the phase of the reference clock signal lags the phase of the feedback clock signal. A width, i.e., duration, of the up and down pulses generated by the phase frequency detector 105 is proportional to the amount of phase difference between the reference clock and the feedback signal.

It should be understood that the up and down pulses generated by the phase frequency detector 105 represent analog signals. The up and down pulses are transmitted to respective inputs of a charge pump 107. The charge pump 107 has an output connected to an input of a loop filter 109. Receipt of the up pulse at the charge pump 107 causes the charge pump 107 to charge the loop filter 109 by an amount proportional to the width of the up pulse. Conversely, receipt of the down pulse at the charge pump 107 causes the charge pump 107 to discharge the loop filter 109 by an amount proportional to the width of the down pulse. In this manner, the amount of charge placed on the loop filter 109 by the charge pump 107 is proportional to the phase difference between the reference clock signal and the feedback signal.

The loop filter 109 has an output connected to an input of a voltage controlled oscillator (VCO) 111. Thus, the voltage present at the output of the loop filter 109 is used to control the VCO 111. The VCO 111 is defined to generate a signal having a frequency that is proportional to the voltage present at the input to the VCO 111. For example, if the voltage present at the input to the VCO 111 increases, the frequency of the signal generated by the VCO 111 increases, vice-versa. Because the frequency stability of the VCO 111 output signal is dependent on the stability of the voltage present at the input to the VCO 111, it is necessary to stabilize the input to the VCO 111. The loop filter 109 is defined to eliminate high frequency harmonics in the signal provided at the input to the VCO 111. Ideally, the loop filter 109 is defined as a low pass loop filter that will remove harmonics above zero, thus providing a clean DC input signal to the VCO 111.

The signal generated and output by the VCO 111 is the PLL output signal (kclk_out) having the frequency (f_kout). The PLL output signal is transmitted to an input of a frequency divider module 115 which is defined to divide the frequency (f_kout) by a value (m) to generate the feedback signal that is transmitted from the output of the frequency divider module 115 to the second input of the phase frequency detector 105. The frequency (f_kout) of the PLL output signal (kclk_out) is equal to the reference clock frequency (f_ref) multiplied by the frequency divider module 115 value (m), i.e., f_kout=(f_ref)*(m). In this manner, the amount of charge placed on the loop filter 109 is used to generate a voltage which speeds or slows the VCO 111.

Each component in the PLL of FIG. 1 is an analog component. The charge pump 107 is an analog circuit which requires stringent analog performance in terms of leakage, offset, matching, output resistance, and headroom. The loop filter 109 is an analog circuit that occupies a large amount of chip area because of the capacitance required for sufficient filtering and stability. Therefore, migration of the analog charge pump 107 and loop filter 109 to sub-micron analog circuits is difficult if not impossible. For example, because leakage increases when thin oxide shrinks, it is not feasible to shrink the thin oxide of the analog charge pump 107 to the sub-micron level and continue to satisfy the leakage requirements of the analog charge pump 107. In view of the foregoing, the analog charge pump 107 and analog loop filter 109 are well-suited candidates for conversion to digital circuitry to enable migration of the PLL to the sub-micron level.

Figure 2A:
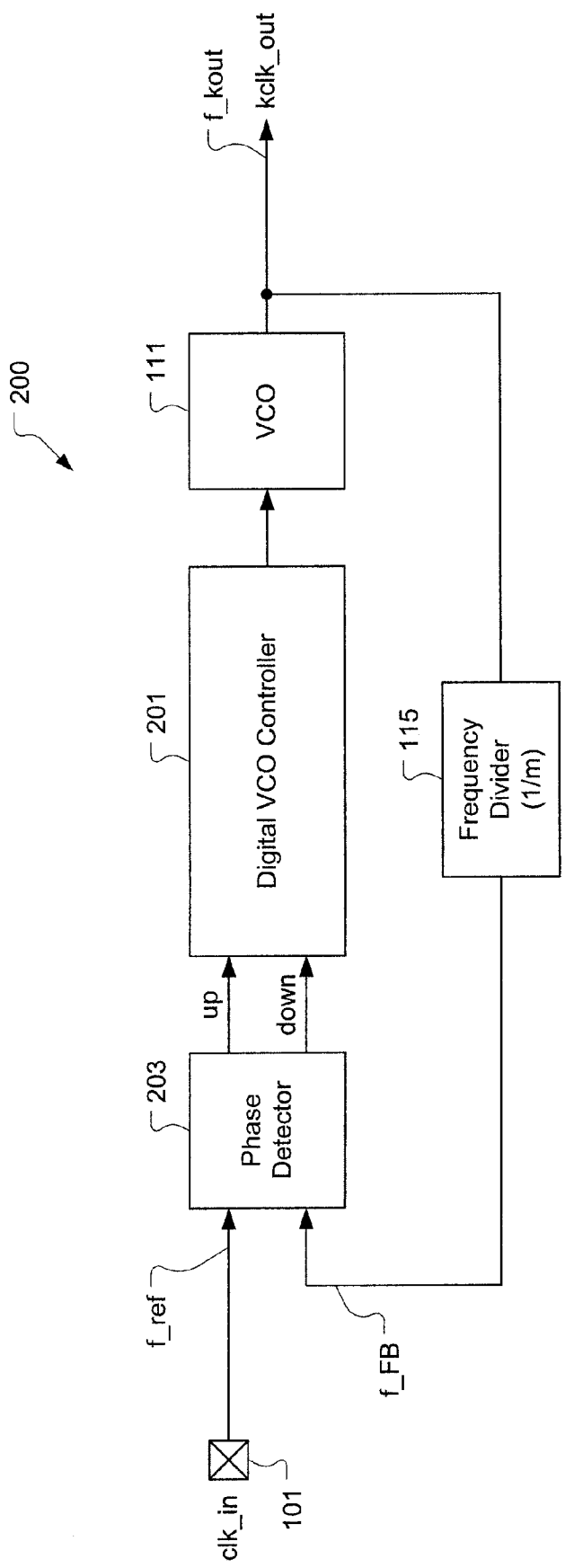
FIG. 2A is an illustration showing a PLL, in accordance with one embodiment of the present invention.

FIG. 2A is an illustration showing a PLL 200, in accordance with one embodiment of the present invention. The PLL 200 provides digital structures to replace the analog charge pump 107 and the analog loop filter 109 in the analog PLL of FIG. 1. The PLL 200 is defined to synthesize a clock frequency from a reference clock signal (clk_in) having the reference clock frequency (f_ref). The reference clock signal (clk_in) is provided to the PLL 200 at the input 101. From the PLL 200 input 101, the reference clock signal (clk_in) having the reference clock frequency (f_ref) is provided as a first input to a phase detector 203. The phase detector 203 is also defined to receive the feedback signal having the frequency (f_FB) at a second input. As with the PLL of FIG. 1, the feedback signal represents a frequency divided version of the PLL 200 output signal.

The phase detector 203 is defined to analyze the phase difference between the signals received at its inputs, i.e., the reference clock signal and the feedback signal. Based on the analyzed phase difference, the phase detector 203 generates an upward adjustment signal and a downward adjustment signal in accordance with the reference clock signal. An asserted upward adjustment signal is generated when the phase of the reference clock signal leads the phase of the feedback signal. An asserted downward adjustment signal is generated when the phase of the reference clock signal lags the phase of the feedback signal. If the phase of the reference clock signal neither leads nor lags the phase of the feedback signal, both of the generated upward and downward adjustment signals are non-asserted.

In one embodiment, the upward and downward adjustment signals are generated as digital signals. For example, in one embodiment, the phase detector 203 is implemented as a binary phase detector defined to: 1) detect whether the edge of the reference clock signal is leading or lagging the edge of the feedback signal, and 2) generate digital output signals corresponding to the above-described upward and downward adjustment signals. In another embodiment, the phase detector 203 is implemented as the analog phase frequency detector 105. In this embodiment, the upward and downward adjustment signals are generated as analog signals that can be interpreted for representation as digital signals. For example, quantization circuitry can be implemented to receive the analog up and down pulses from the phase frequency detector and quantize them into digital signals representing the upward and downward adjustment signals, respectively.

The upward and downward adjustment signals are transmitted from the phase detector 203 to respective inputs of a digital VCO controller 201. It should be appreciated that the digital VCO controller 201 effectively replaces the charge pump 107 and loop filter 109, as previously described with respect to FIG. 1. The digital VCO controller 201 is defined to receive and process the upward and downward adjustment signals in a digital manner to generate a control voltage in response to the upward and downward adjustment signals. It should be further appreciated that the digital architecture of the digital VCO controller 201 is scalable to sub-micron technology nodes. Thus, implementation of the digital VCO controller 201 in lieu of the charge pump 107 and loop filter 109 enables large portions of the PLL 200 to be scaled down to sub-micron levels.

The control voltage generated by the digital VCO controller 201 is transmitted through an output of the digital VCO controller 201 to an input of the VCO 111. As with the PLL of FIG. 1, the VCO 111 is defined to operate in response to the control voltage to generate the output signal (kclk_out) of the PLL 200, having the frequency (f_kout). More specifically, the VCO 111 is defined to generate the signal (kclk_out) having the frequency (f_kout) that is proportional to the voltage present at the input to the VCO 111, as provided by the digital VCO controller 201. For example, if the voltage present at the input to the VCO 111 increases, the frequency (f_kout) of the signal (kclk_out) generated by the VCO 111 increases, vice-versa.

The PLL 200 output signal (kclk_out) generated and output by the VCO 111 is transmitted to an input of the frequency divider module 115 which is defined to divide the frequency (f_kout) by a value (m) to generate the feedback signal that is transmitted from the output of the frequency divider module 115 to the second input of the phase detector 203. In the embodiment of FIG. 2A, the frequency (f_kout) of the PLL output signal (kclk_out) is equal to the reference clock frequency (f_ref) multiplied by the frequency divider module 115 value (m), i.e., f_kout=(f_ref)*(m). In this manner, the digital VCO controller 201 functions to generate a voltage which speeds or slows the VCO 111 as necessary to maintain the relationship f_kout=(f_ref)*(m).

Figure 2B:
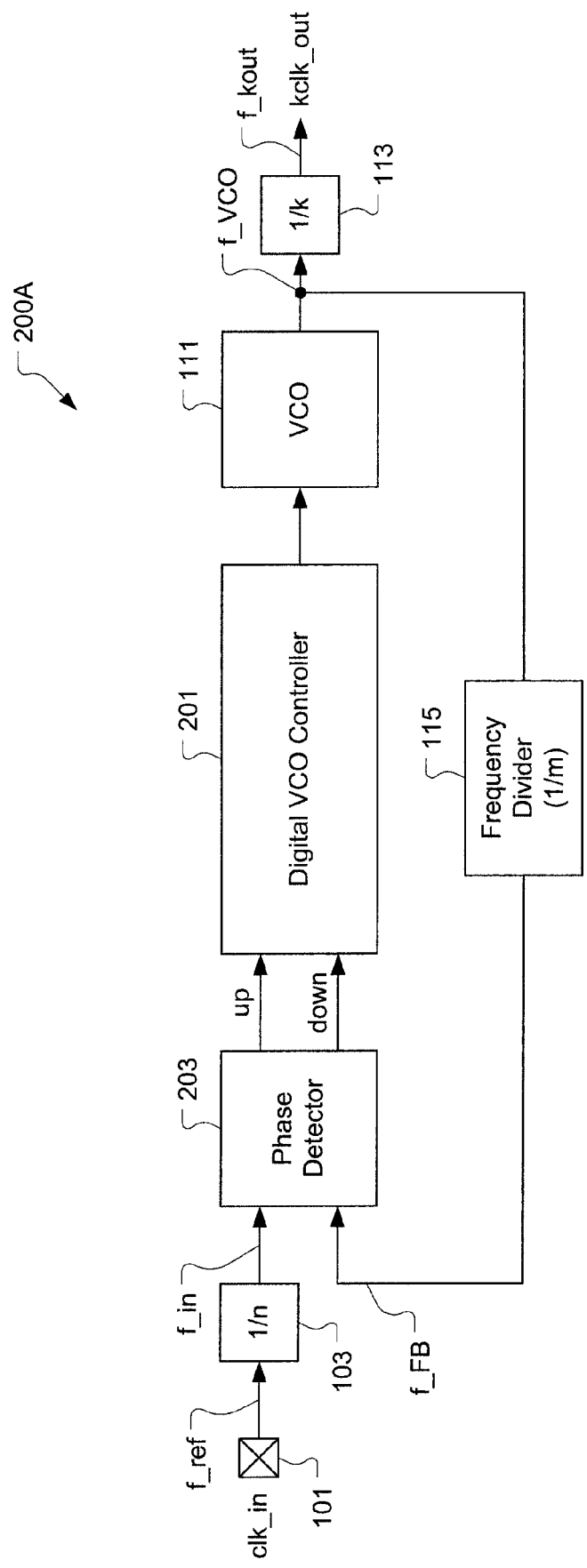
FIG. 2B is an illustration showing a PLL that implements additional frequency divider modules, in accordance with one embodiment of the present invention.

It should be appreciated, however, that the PLL 200 can be defined to include additional frequency divider modules to enable derivation of additional frequencies from the reference clock frequency (f_ref). FIG. 2B is an illustration showing a PLL 200A that implements additional frequency divider modules 103 and 113, in accordance with one embodiment of the present invention. With respect to FIG. 2B, the phase detector 203, digital VCO controller 201, VCO 111, and frequency divider module 115 are defined in the same manner as described above with respect to FIG. 2A.

The frequency divider module 103 is connected to receive the reference clock signal (clk_in) as an input. The frequency divider module 103 functions to divide the reference clock frequency (f_ref) by an integer value (n) to generate an output signal having a frequency (f_in). The output signal of frequency (f_in) is provided as the first input to the phase detector 203. Therefore, the phase detector 203 will function to generate the upward and downward adjustment signals based on comparison of the signal of frequency (f_in) with the feedback signal of frequency (f_FB). The frequency divider module 113 is connected to receive the VCO 111 output signal having frequency (f_VCO) as an input. The frequency divider module 113 functions to divide the VCO 111 output signal frequency (f_VCO) by an integer value (k) to generate the PLL 200A output signal (kclk_out) having the frequency (f_out), where f_out=(f_in)*(m/(n*k)).

Figure 3:
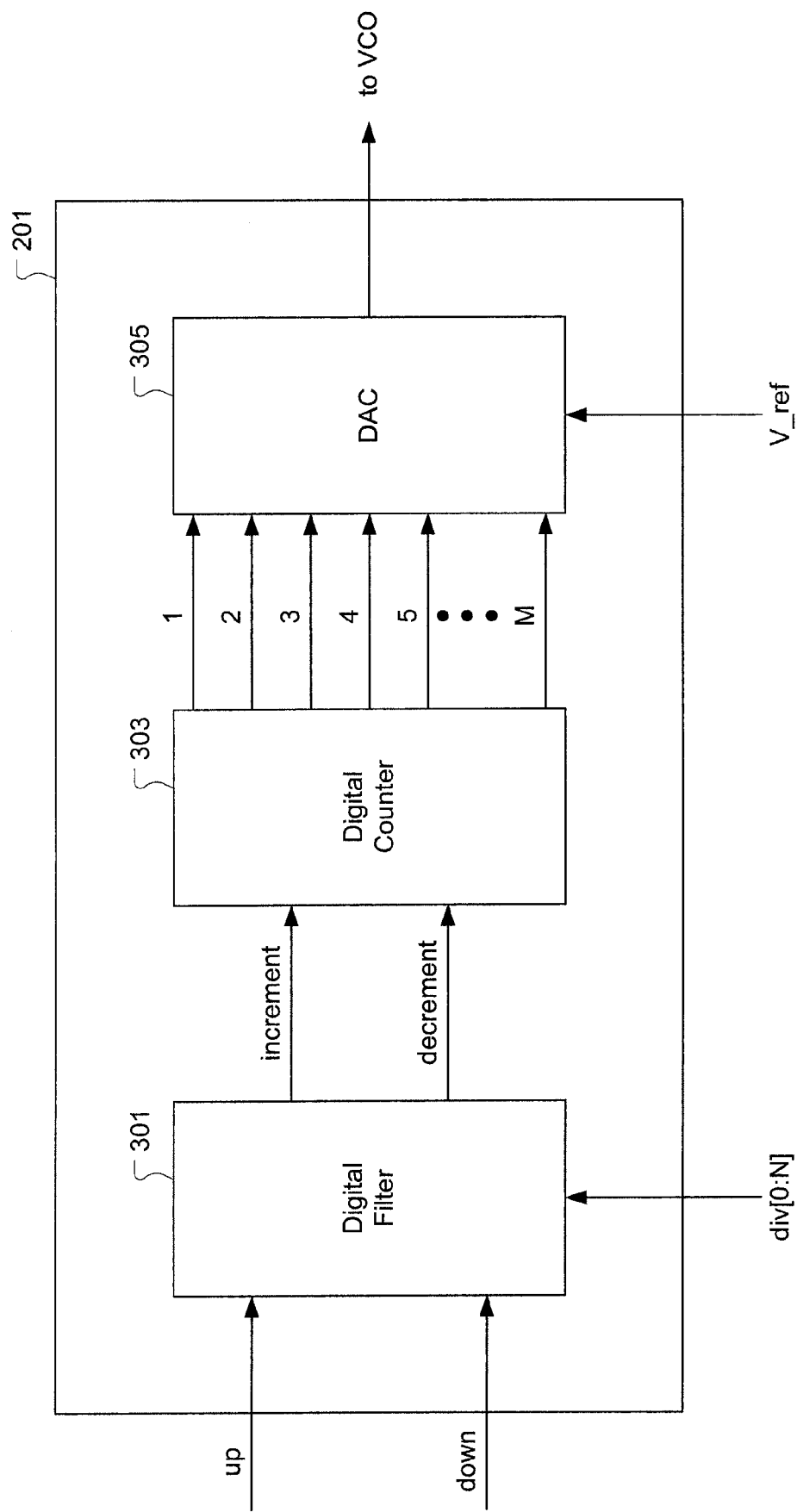
FIG. 3 is an illustration showing the digital VCO controller, in accordance with one embodiment of the present invention.

The digital VCO controller 201 functions in the same manner regardless of the number of frequency divider modules implemented within the PLL 200. FIG. 3 is an illustration showing the digital VCO controller 201, in accordance with one embodiment of the present invention. The digital VCO controller 201 includes a digital filter 301 defined to have a first input for receiving the upward adjustment signal from the phase detector 203, and a second input for receiving the downward adjustment signal from the phase detector 203. The digital filter 301 is defined to generate an increment signal and a decrement signal in response to the upward and downward adjustment signals. The digital filter 301 provides the generated increment signal on a first output and the generated decrement signal on a second output. The digital filter 301 is defined to generate an asserted increment signal when a required number of consecutively asserted upward adjustment signals is received at the first input of the digital filter 301, from the phase detector 203. Similarly, the digital filter 301 is defined to generate an asserted decrement signal when a required number of consecutively asserted downward adjustment signals is received at the second input of the digital filter 301, from the phase detector 203. The consecutive assertion of upward and downward adjustment signals is evaluated by the digital filter 301 on clock cycle-to-clock cycle basis.

In one embodiment, the required number of consecutively asserted upward adjustment signals is equal to the required number of consecutively asserted downward adjustment signals. The digital filter 301 includes an N-bit input for receiving an N-bit signal (div[0:(N−1)]) defining the required number of consecutively asserted (upward/downward) adjustment signals. In one embodiment, the required number of consecutively asserted (upward/downward) adjustment signals is stored in a register that can be programmed manually. In an embodiment where the PLL is defined on a programmable logic device (PLD), the required number of consecutively asserted (upward/downward) adjustment signals is stored in a configuration random access memory (CRAM) cell that can be programmed during configuration of the PLD. In another embodiment, the required number of consecutively asserted (upward/downward) adjustment signals is simply hardwired within the PLL circuit, e.g., within the digital filter 301 logic.

It should be appreciated that the required number of consecutively asserted (upward/downward) adjustment signals represents a sensitivity control for the PLL 200. This sensitivity control governs how closely changes in the reference clock frequency (f_ref) are tracked by the PLL 200. More specifically, a lower value for the required number of consecutively asserted (upward/downward) adjustment signals provides a finer, i.e., tighter, tracking of the PLL output signal frequency (f_kout) to the reference clock frequency (f_ref). Conversely, a higher value for the required number of consecutively asserted (upward/downward) adjustment signals provides a coarser, i.e., looser or more average, tracking of the PLL output signal frequency (f_kout) to the reference clock frequency (f_ref).

If the reference clock signal (clk_in) is quite stable, e.g., crystal-generated, one may prefer to set (div[0:(N−1)]) at a lower value to more closely track changes in the reference clock frequency (f_ref). Conversely, if the reference clock signal (clk_in) is unstable and the PLL output signal (kclk_out) needs to be more stable, one may prefer to set (div[0:(N−1)]) at a higher value to track changes in the reference clock frequency (f_ref) in a more average manner, thus avoiding a transfer of frequency noise from the reference clock signal (clk_in) to the PLL output signal (kclk_out).

The digital VCO controller 201 also includes a digital counter 303, i.e., an M-bit counter 303, having a first input for receiving the increment signal from the digital filter 301, and a second input for receiving the decrement signal from the digital filter 301. The digital counter 303 is defined to generate a multi-bit, i.e., M-bit, output signal that represents a running sum of the increment and decrement signals. More specifically, the digital counter 303 is defined to increment the running sum by one upon receipt of each asserted increment signal. The digital counter 303 is also defined to decrement the running sum by one upon receipt of each asserted decrement signal. When both of the received increment and decrement signals are non-asserted, the digital counter 303 is defined to leave the running sum unchanged. In each clock cycle, the running sum is updated by the digital counter 303 in accordance with the currently generated increment and decrement signals. It should be appreciated that the number of bits (M) in the multi-bit output of the digital counter 303 defines a numerical range within which the running sum can vary, i.e., the value of the running sum can vary from 0 to $(2^M-1)$.

The digital VCO controller 201 further includes a digital-to-analog converter (DAC) 305 having a multi-bit, i.e., M-bit, input for receiving the running sum output signal from the digital counter 303. In response to the running sum value received at the input of the DAC 305, the DAC 305 is defined to generate and output the control voltage that is provided to the input of the VCO 111. More specifically, in each clock cycle, the value of the running sum is provided as a digital input to a DAC 305. The DAC 305 is defined to output a voltage that is indexed to the value of the running sum received at its input.

Because the input of the DAC 305 is defined by (M) bits, the maximum input value to the DAC 305 is equal to $(2^M-1)$. The maximum output voltage of the DAC 305 corresponds to a reference voltage (V_ref) provided to the DAC 305. A minimum output voltage increment size that can be provided by the DAC 305 is determined by dividing the reference voltage (V_ref) by the number of different running sum input values, i.e., $(2^M-1)$, that be received at the input of the DAC 305. The output voltage generated by the DAC 305 ranges from 0 to (V_ref) in increments corresponding to minimum output voltage increment size. Each possible output voltage of the DAC 305 is indexed in a sequential manner to a particular value of the running sum. For example, an output voltage of 0 is indexed to the running sum value of 0, and the output voltage of (V_ref) is indexed to the running sum value of $(2^M-1)$. It should be appreciated that the minimum output voltage increment size of the DAC 305 represents the resolution of the DAC 305.

Because the resolution of the PLL 200, in terms of minimum frequency adjustment amount, is defined by the resolution of the input voltage to the VCO 111, the resolution of the PLL 200 is defined by the resolution of the DAC 305. In one embodiment, the number of bits (M) used to define both the available range of the running sum and the resolution of the DAC 305 can be programmed manually. More specifically, in one embodiment, the number of bits (M) to be used at the input of the DAC 305 may be programmed to a number less than the maximum number of bits actually available at the input of the DAC 305. Programming the DAC 305 to use a larger number of input bits serves to increase the resolution of the PLL 200. Conversely, programming the DAC 305 to use a fewer number of input bits serves to reduce the resolution of the PLL 200.

Figure 4B:
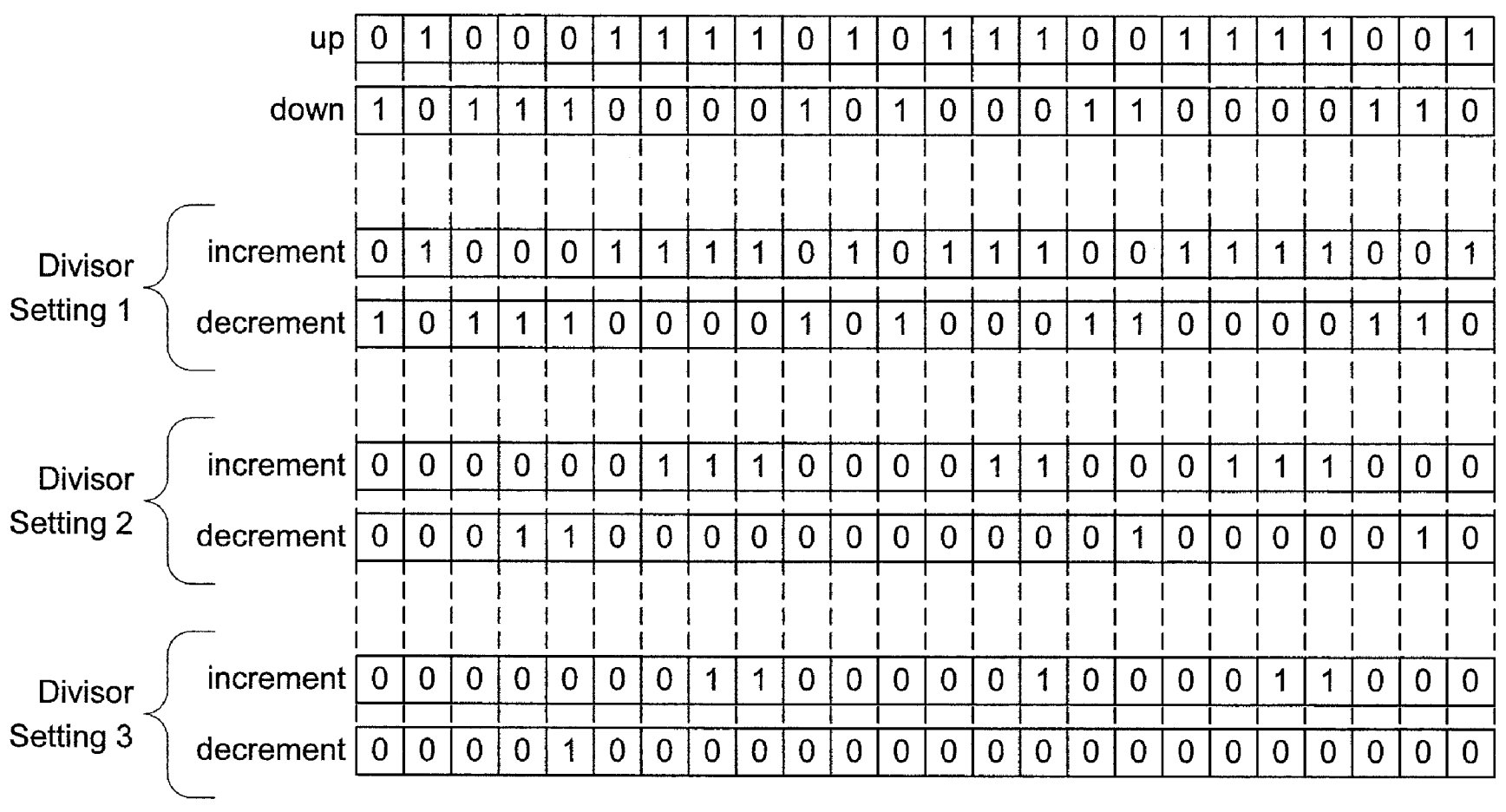

FIGS. 4A-4B are illustrations showing an example of the functionality provided by the digital filter 301 of the digital VCO controller 201, in accordance with one embodiment of the present invention. FIG. 4A shows a table of available settings for the N-bit signal (div[0:(N−1)]), where N equals 3. Each setting of the N-bit signal represents a particular divisor setting value. The particular divisor setting value represents the required number of consecutively asserted (upward/downward) adjustment signals.

FIG. 4B shows an exemplary pair of upward and downward adjustment signals processed by the digital filter 301 in accordance with divisor settings of 1, 2, and 3. With the divisor setting of 1, the digital filter 301 functions to generate an asserted increment signal upon receipt of each asserted upward adjustment signal. Also, with the divisor setting of 1, the digital filter 301 functions to generate an asserted decrement signal upon receipt of each asserted downward adjustment signal. Therefore, with the divisor setting of 1, the digital filter 301 functions to replicate the upward and downward adjustment signals on the increment and decrement signals, respectively. It should be appreciated that the divisor setting of 1 directs the digital filter 301 to provide the highest available sensitivity with respect to tracking changes in the reference clock frequency.

Also as shown in FIG. 4B, with the divisor setting of 2, the digital filter 301 functions to generate an asserted increment signal at each clock cycle when 2 consecutively asserted upward adjustment signals have been received. Also, with the divisor setting of 2, the digital filter 301 functions to generate an asserted decrement signal at each clock cycle when 2 consecutively asserted downward adjustment signals have been received. Furthermore, with the divisor setting of 3, the digital filter 301 functions to generate an asserted increment signal at each clock cycle when 3 consecutively asserted upward adjustment signals have been received. Also, with the divisor setting of 3, the digital filter 301 functions to generate an asserted decrement signal at each clock cycle when 3 consecutively asserted downward adjustment signals have been received. It should be appreciated that as the divisor setting value increases, the digital filter 301 functions to track changes in the reference clock frequency in a less sensitive manner.

FIG. 5A is an illustration showing an example of the functionality provided by the digital counter 303 and DAC 305 of the digital VCO controller 201, in accordance with one embodiment of the present invention. In the exemplary embodiment of FIG. 5A, the digital counter 303 is defined to generate a 4-bit output signal, and the DAC 305 is defined to receive a 4-bit input signal. Therefore, in the example of FIG. 5A, the running sum generated by the digital counter 303 can vary over a range extending from 0 to 15, i.e., from 0 to $(2^4-1)$. It should be appreciated that essentially any number of bits can be used for the output signal of the digital counter 303 and the input of the DAC 305.

Also, in the example of FIG. 5A, the reference voltage provided to the DAC 305 is 1.20 V. This reference voltage (1.20 V) is divided by 15, i.e., by $(2^4-1)$, to establish the minimum output voltage increment size of the DAC 305. Therefore, in the example of FIG. 5A, the output voltage of the DAC 305 varies from 0 to 1.20 V in increments of 0.08 V. Also, each possible output voltage of the DAC 305 is indexed to a particular value of the running sum. When a particular value of the running sum is present at the input of the DAC 305, the DAC 305 will output the voltage indexed to the particular value. For example, if the running sum value of 9 is provided at the input of the DAC 305, the DAC 305 will output the voltage 0.72 V. Similarly, if the running sum value of 3 is provided at the input of the DAC 305, the DAC 305 will output the voltage 0.24 V.

Figure 5C:
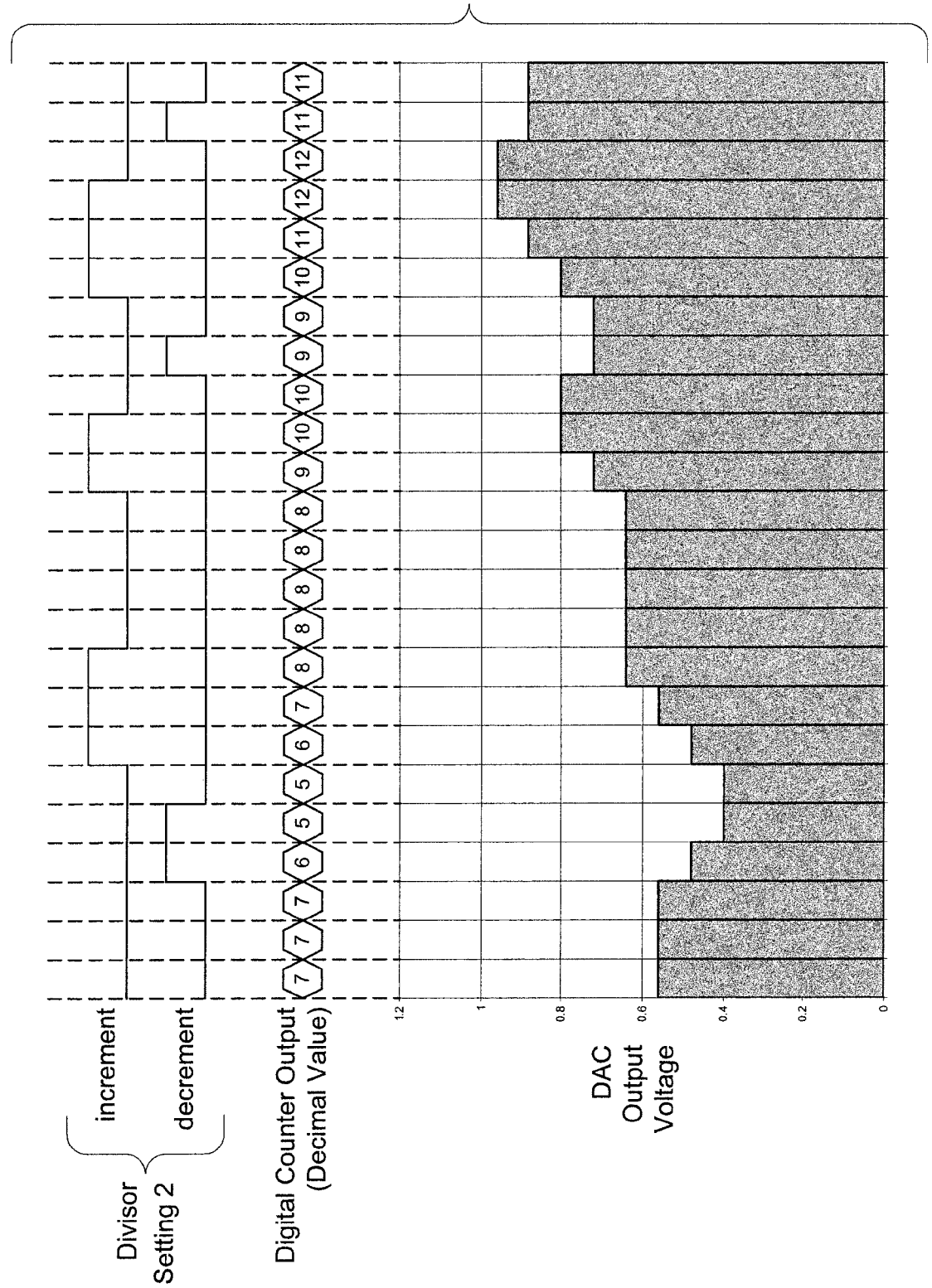

FIGS. 5B-5D are illustrations showing an example of the functional interaction between the digital filter 301, the digital counter 303, and the DAC 305, in accordance with one embodiment of the present invention. FIGS. 5B-5D represent a combination of the example functionality illustrated in each of FIGS. 4A, 4B, and 5A. FIG. 5B shows the increment and decrement waveforms based on the exemplary upward and downward adjustment signals of FIG. 4B, as generated by the digital filter 301 having a divisor setting of 1. Prior to the first clock cycle in the example of FIG. 5B, the running sum within the digital counter 303 is assumed to have a decimal value of 8. The digital counter output shows how the decimal value of the running sum varies as the increment and decrement signals are received by the digital counter 303 from the digital filter 301. FIG. 5B also includes a plot of the DAC 305 output voltage as indexed to the various decimal values of the running sum, as presented in the example of FIG. 5A.

FIG. 5C shows the increment and decrement waveforms based on the exemplary upward and downward adjustment signals of FIG. 4B, as generated by the digital filter 301 having a divisor setting of 2. Prior to the first clock cycle in the example of FIG. 5C, the running sum within the digital counter 303 is assumed to have a decimal value of 7. The digital counter output shows how the decimal value of the running sum varies as the increment and decrement signals are received by the digital counter 303 from the digital filter 301. FIG. 5C also includes a plot of the DAC 305 output voltage as indexed to the various decimal values of the running sum, as presented in the example of FIG. 5A.

FIG. 5D shows the increment and decrement waveforms based on the exemplary upward and downward adjustment signals of FIG. 4B, as generated by the digital filter 301 having a divisor setting of 3. Prior to the first clock cycle in the example of FIG. 5D, the running sum within the digital counter 303 is assumed to have a decimal value of 7. The digital counter output shows how the decimal value of the running sum varies as the increment and decrement signals are received by the digital counter 303 from the digital filter 301. FIG. 5D also includes a plot of the DAC 305 output voltage as indexed to the various decimal values of the running sum, as presented in the example of FIG. 5A. Examination of the examples presented in FIGS. 5B-5D shows how increasing the divisor setting, i.e., reducing the sensitivity of the digital filter 301, directs the PLL 200 to track changes in the reference clock frequency in a looser or more average manner.

Figure 6:
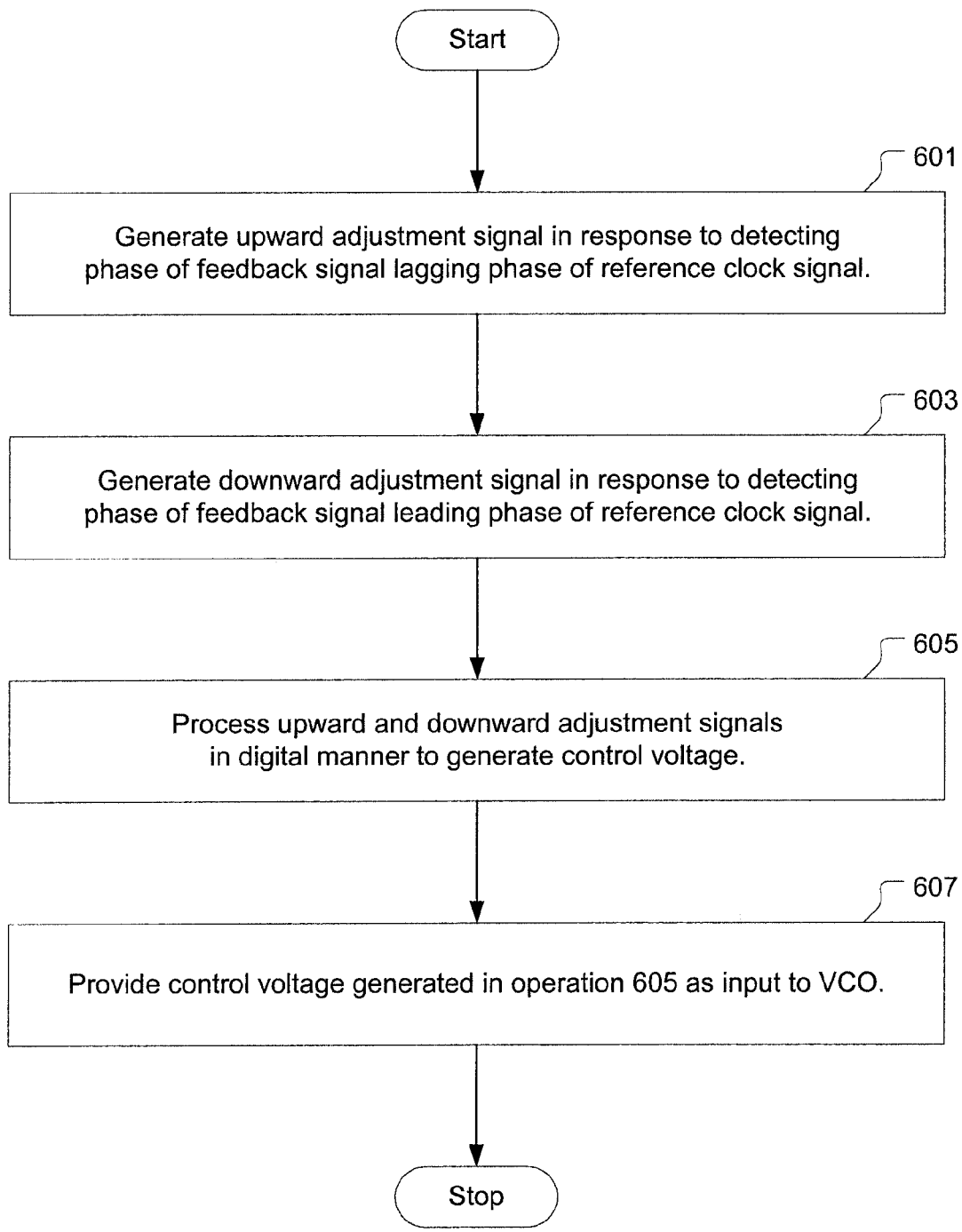
FIG. 6 is an illustration showing a flowchart of a method for operating a PLL, in accordance with one embodiment of the present invention.

FIG. 6 is an illustration showing a flowchart of a method for operating a PLL, in accordance with one embodiment of the present invention. The method includes an operation 601 for generating an upward adjustment signal in response to detecting that a phase of a feedback signal lags a phase of a reference clock signal. The method also includes an operation 603 for generating a downward adjustment signal in response to detecting that the phase of the feedback signal leads the phase of the reference clock signal. In operations 601 and 603, the feedback signal represents a frequency divided version of an output signal of the PLL, where the output signal of the PLL is generated by a VCO. In one embodiment, the upward and downward adjustment signals are generated as digital signals. In another embodiment, the upward and downward adjustment signals are generated as analog signals that can be interpreted for representation as digital signals.

An asserted upward adjustment signal indicates that a frequency of the feedback signal should be adjusted upward. A non-asserted upward adjustment signal indicates that the frequency of the feedback signal should not be adjusted upward. An asserted downward adjustment signal indicates that the frequency of the feedback signal should be adjusted downward. A non-asserted downward adjustment signal indicates that the frequency of the feedback signal should not be adjusted downward. In a given clock cycle, assertion of the upward and downward adjustment signals is mutually exclusive. Also, in a given clock cycle, both the upward and downward adjustment signals may be non-asserted.

It should be understood that the operations 601 and 603 are performed in a parallel manner. In one embodiment, detection of whether the phase of the feedback signal lags or leads the phase of the reference clock signal is performed by processing the feedback signal and the reference clock signal through a phase detector. In one embodiment, the phase detector is a binary phase detector defined to generate the upward and downward adjustment signals in a binary, i.e., digital, format. In another embodiment, the phase detector is a phase frequency detector defined to generate analog upward and downward adjustment signals that can be subsequently interpreted for representation as corresponding digital signals.

The method further includes an operation 605 for processing the upward and downward adjustment signals in a digital manner to generate a control voltage. Thus, the control voltage is generated in response to the upward and downward adjustment signals. In an operation 607, the control voltage generated in operation 605 is provided as input to a VCO. The VCO operates in response to the control voltage to generate the output signal of the PLL. As mentioned above, a frequency divided version of the output of the VCO represents the feedback signal processed in operations 601 and 603.

Processing of the upward and downward adjustment signals in the digital manner in operation 605 includes generating an asserted increment signal when a required number of consecutively asserted upward adjustment signals is generated through operation 601, where the consecutive assertion is evaluated on clock cycle-to-clock cycle basis. Similarly, processing of the upward and downward adjustment signals in the digital manner also includes generating an asserted decrement signal when a required number of consecutively asserted downward adjustment signals is generated through operation 603, where the consecutive assertion is evaluated on clock cycle-to-clock cycle basis.

With respect to the foregoing, the required number of consecutively asserted upward adjustment signals is equal to the required number of consecutively asserted downward adjustment signals. In one embodiment, the required number of consecutively asserted (upward/downward) adjustment signals is stored in a register (CRAM) that can be programmed manually. In an embodiment where the PLL is defined on a programmable logic device (PLD), the required number of consecutively asserted (upward/downward) adjustment signals is stored in a configuration random access memory (CRAM) cell that can be programmed during configuration of the PLD. In another embodiment, the required number of consecutively asserted (upward/downward) adjustment signals is simply hardwired within the PLL circuit. Furthermore, in one embodiment, the required number of consecutively asserted (upward/downward) adjustment signals having been established can be adjusted automatically during operation of the PLL based on a user-defined algorithm that monitors the variability in the reference clock frequency.

It should be appreciated that the required number of consecutively asserted (upward/downward) adjustment signals represents a sensitivity control for the PLL. This sensitivity control governs how closely changes in the frequency of the reference clock signal are tracked by the PLL. More specifically, a lower value for the required number of consecutively asserted (upward/downward) adjustment signals provides a finer, i.e., tighter, tracking of the PLL output signal frequency to the reference clock signal frequency. Conversely, a higher value for the required number of consecutively asserted (upward/downward) adjustment signals provides a coarser, i.e., looser or more average, tracking of the PLL output signal frequency to the reference clock signal frequency. If the reference clock signal is quite stable, e.g., crystal-generated, one may prefer to set the required number of consecutively asserted (upward/downward) adjustment signals at a lower value to more closely track changes in the reference clock signal frequency. Conversely, if the reference clock signal is unstable and the PLL output signal needs to be more stable, one may prefer to set the required number of consecutively asserted (upward/downward) adjustment signals at a higher value to track changes in the reference clock signal frequency in a more average manner, thus avoiding a transfer of frequency noise from the reference clock signal to the PLL output signal.

The processing in operation 605 further includes incrementing a running sum by one upon generation of each asserted increment signal, and decrementing the running sum by one upon generation of each asserted decrement signal. When both of the increment and decrement signals are non-asserted, the running sum is not changed. In each clock cycle, the running sum is updated in accordance with the currently generated increment and decrement signals. In each clock cycle, the value of the running sum is provided as a digital input to a DAC. The DAC is defined to output a voltage corresponding to the value received at its input. The voltage output by the DAC represents the control voltage generated in operation 605 and provided to the VCO input in operation 607. Thus, the control voltage is generated by the DAC in response to the running sum, wherein the running sum is generated based on the increment and decrement signals, wherein the increment and decrement signals are generated based on the upward and downward adjustment signals and the required number of consecutively asserted upward and downward adjustment signals.

The input of the DAC is defined by a fixed number (M) of bits. Therefore, the input value provided to the DAC is limited to the maximum value that can be represented by the number of bits (M) available on the input of the DAC, i.e., the maximum input value to the DAC is equal to $(2^M-1)$. The running sum that is generated for input to the DAC is also represented by the number of bits (M). Therefore, the value of the running sum will be maintained within the input range of the DAC. The maximum output voltage of the DAC, i.e., reference voltage of the DAC, is divided by the number of input values that can be received by the DAC to define a minimum output voltage increment size that can be provided by the DAC. The minimum output voltage increment size represents the resolution of the DAC.

Because the resolution of the PLL, in terms of minimum frequency adjustment amount, is defined by the resolution of the input voltage to the VCO, the resolution of the PLL is defined by the resolution of the DAC, which provides the input voltage to the VCO. In one embodiment, the number of bits (M) used to define both the available range of the running sum and the resolution, i.e., precision, of the DAC can be programmed manually. More specifically, in one embodiment, the number of bits (M) to be used at the input of the DAC may be programmed to a number less than the maximum number of bits actually available at the input of the DAC. Programming the DAC to use a larger number of input bits serves to increase the resolution of the PLL, i.e., serves to decrease a coarseness of the frequency adjustment capability of the PLL. Conversely, programming the DAC to use a fewer number of input bits serves to reduce the resolution of the PLL, i.e., serves to increase a coarseness of the frequency adjustment capability of the PLL.

It should be appreciated that the digitized PLL of the present invention, including the digital VCO controller, facilitates migration of the PLL circuitry to smaller technology nodes, wherein the size of the technology node can be as small as allowed by the integrated circuit manufacturing capability. Digitization of the PLL and its migration to smaller technology provides for savings in engineering design time and optimization of chip area.

The digitized phase lock loop of the present invention may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any other suitable application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A digital controller for a voltage controlled oscillator (VCO), comprising:
    a digital filter having a first input for receiving an upward adjustment signal and a second input for receiving a downward adjustment signal, the digital filter defined to generate an increment signal in response to the upward adjustment signal and to generate a decrement signal in response to the downward adjustment signal;
    a digital counter having a first input for receiving the increment signal and a second input for receiving the decrement signal, the digital counter defined to generate a multi-bit output signal that represents a running sum of the increment and decrement signals; and
    a digital-to-analog converter (DAC) having a multi-bit input for receiving the multi-bit output signal to be generated by the digital counter, the DAC defined to generate a control voltage in response to receipt of the multi-bit output signal from the digital counter.

2. A digital controller for a VCO as recited in claim 1, wherein the upward and downward adjustment signals are digital versions of output signals generated by a phase detector.

3. A digital controller for a VCO as recited in claim 1, wherein the digital filter includes a third input for receiving a sensitivity control signal, the sensitivity control signal indicating a number of consecutive upward adjustment signals required to generate an asserted increment signal and a number of consecutive downward adjustment signals required to generate an asserted decrement signal.

4. A digital controller for a VCO as recited in claim 3, wherein the digital counter is defined to increment the running sum by one upon receipt of each asserted increment signal, the digital counter further defined to decrement the running sum by one upon receipt of each asserted decrement signal.

5. A digital controller for a VCO as recited in claim 1, wherein a number of bits in the multi-bit input of the DAC is equal to a number of bits in the multi-bit output signal generated by the digital counter.

6. A digital controller for a VCO as recited in claim 5, wherein the number of bits in each of the multi-bit output signal generated by the digital counter and the multi-bit input of the DAC defines a precision of the digital controller.

7. A digital controller for a VCO as recited in claim 1, wherein the DAC is defined to incrementally adjust the control voltage by an amount equal to a reference voltage divided by $(2^M-1)$, where M is the number of bits in each of the multi-bit output signal generated by the digital counter and the multi-bit input of the DAC.

8. A phase lock loop (PLL) circuit, comprising:
a phase detector defined to generate an upward adjustment signal when a phase of a feedback signal lags a phase of a reference clock signal, the phase detector further defined to generate a downward adjustment signal when the phase of the feedback signal leads the phase of the reference clock signal;
a digital controller defined to receive and process the upward and downward adjustment signals in a digital manner to generate a control voltage in response to the upward and downward adjustment signals, wherein the digital controller is further defined to provide a sensitivity control to govern how changes in the reference clock signal are tracked by the PLL;
a voltage controlled oscillator (VCO) defined to receive the control voltage from the digital controller and generate a PLL output signal having a frequency that is a function of the received control voltage; and
a frequency divider defined to receive the PLL output signal and divide the frequency of the PLL output signal by an integer value to generate the feedback signal to be processed by the phase detector.

9. A PLL circuit as recited in claim 8, wherein the phase detector is a binary phase detector defined to generate the upward and downward adjustment signals in a binary form.

10. A PLL circuit as recited in claim 8, wherein the digital controller includes,
a digital filter defined to generate an increment signal and a decrement signal in response to the upward and downward adjustment signals,
a digital counter defined to generate a multi-bit output signal that represents a running sum of the asserted increment and decrement signals, and
a digital-to-analog converter (DAC) having a multi-bit input for receiving the multi-bit output signal to be generated by the digital counter, the DAC defined to generate the control voltage in response to receipt of the multi-bit output signal from the digital counter.

11. A PLL circuit as recited in claim 10, wherein the digital filter is defined to receive a sensitivity control signal indicating a number of consecutive upward adjustment signals required to generate an asserted increment signal and a number of consecutive downward adjustment signals required to generate an asserted decrement signal.

12. A PLL circuit as recited in claim 11, wherein the digital counter is defined to increment the running sum by one upon receipt of each asserted increment signal, the digital counter further defined to decrement the running sum by one upon receipt of each asserted decrement signal.

13. A PLL circuit as recited in claim 11, wherein the sensitivity control signal is programmable.

14. A PLL circuit as recited in claim 10, wherein the DAC is defined to incrementally adjust the control voltage by an amount equal to a reference voltage divided by $(2^M-1)$, wherein M is a number of bits in each of the multi-bit output signal generated by the digital counter and the multi-bit input of the DAC.

15. A PLL circuit as recited in claim 10, wherein M is a programmable value.

16. A method for operating a phase lock loop (PLL), comprising:
generating an upward adjustment signal in response to a phase of a feedback signal lagging a phase of a reference clock signal, the feedback signal representing a frequency divided version of an output signal of the PLL;
generating a downward adjustment signal in response to the phase of the feedback signal leading the phase of the reference clock signal;
processing the upward and downward adjustment signals in a digital manner to generate a control voltage in response to the upward and downward adjustment signals, wherein processing the upward and downward adjustment signals in a digital manner includes generating an asserted increment signal upon consecutive generation of a set number of asserted upward adjustment signals, and generating an asserted decrement signal upon consecutive generation of the set number of asserted downward adjustment signals; and
operating a voltage controlled oscillator (VCO) to generate the output signal of the PLL in response to the control voltage.

17. A method for operating a PLL as recited in claim 16, wherein the set number is acquired through a programmable sensitivity control signal.

18. A method for operating a PLL as recited in claim 16, wherein processing the upward and downward adjustment signals in a digital manner further includes incrementing a running sum by one upon generation of each asserted increment signal, and decrementing the running sum by one upon generation of each asserted decrement signal.

19. A method for operating a PLL as recited in claim 18, wherein processing the upward and downward adjustment signals in a digital manner further includes providing the running sum as a digital input to a digital-to-analog converter (DAC), wherein the control voltage is generated by the DAC in response to receipt of the running sum as the digital input.

20. A method for operating a PLL as recited in claim 19, further comprising:
programming a number M of bits used to define both an available range of the running sum and a precision of the DAC, wherein the DAC is defined to incrementally adjust the control voltage by an amount equal to a reference voltage divided by $(2^M-1)$.

21. A method for operating a digital controller for a voltage controlled oscillator (VCO), comprising:
receiving an upward adjustment signal at the digital controller;
generating a digital increment signal in response to receiving the upward adjustment signal;
receiving a downward adjustment signal at the digital controller;
generating a digital decrement signal in response to receiving the downward adjustment signal;

generating an output signal that represents a running sum of the generated digital increment and decrement signals;

generating an analog control voltage corresponding to the running sum; and transmitting the analog control voltage from the digital controller to the VCO.

22. A method for operating a digital controller for a VCO as recited in claim 21, wherein the upward and downward adjustment signals are digital versions of output signals generated by a phase detector.

23. A method for operating a digital controller for a VCO as recited in claim 21, further comprising:

receiving a sensitivity control signal at the digital controller, the sensitivity control signal indicating a number of consecutive upward adjustment signals required to be received to generate the digital increment signal and a number of consecutive downward adjustment signals required to be received to generate the digital decrement signal.

24. A method for operating a digital controller for a VCO as recited in claim 21, further comprising:

incrementing the running sum by one in response to generation of each digital increment signal, and decrementing the running sum by one in response to generation of each digital decrement signal.

25. A method for operating a digital controller for a VCO as recited in claim 21, further comprising:

operating a digital filter to receive the upward adjustment signal and generate the digital increment signal;

operating the digital filter to receive the downward adjustment signal and generate the digital decrement signal;

operating a digital counter to generate the output signal that represents the running sum of the generated digital increment and decrement signals; and operating a digital-to-analog converter to generate the analog control voltage corresponding to the running sum.

* * * * *